US009559215B1

(12) United States Patent
Ahmed et al.

(10) Patent No.: US 9,559,215 B1
(45) Date of Patent: Jan. 31, 2017

(54) METHOD AND APPARATUS FOR MAKING P-CHANNEL THIN FILM TRANSISTORS FOR OLED AND LED ACTIVE MATRIX FLAT PANEL DISPLAYS

(71) Applicants: Khaled Ahmed, Anaheim, CA (US); Prashant Majhi, San Jose, CA (US)

(72) Inventors: Khaled Ahmed, Anaheim, CA (US); Prashant Majhi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/757,875

(22) Filed: Dec. 23, 2015

(51) Int. Cl.
| | |
|---|---|
| *H01L 29/786* | (2006.01) |
| *H01L 29/12* | (2006.01) |
| *H01L 29/24* | (2006.01) |
| *H01L 21/02* | (2006.01) |
| *H01L 21/425* | (2006.01) |
| *H01L 21/477* | (2006.01) |
| *H01L 21/385* | (2006.01) |
| *H01L 29/66* | (2006.01) |
| *H01L 27/12* | (2006.01) |

(52) U.S. Cl.
CPC ... *H01L 29/78696* (2013.01); *H01L 21/02565* (2013.01); *H01L 21/02584* (2013.01); *H01L 21/02631* (2013.01); *H01L 21/385* (2013.01); *H01L 21/425* (2013.01); *H01L 21/477* (2013.01); *H01L 27/127* (2013.01); *H01L 27/1225* (2013.01); *H01L 29/247* (2013.01); *H01L 29/66969* (2013.01); *H01L 29/78693* (2013.01)

(58) Field of Classification Search
CPC .............. H01L 29/7869; H01L 21/78693
See application file for complete search history.

(56) References Cited

U.S. PATENT DOCUMENTS

2015/0144942 A1* 5/2015 Yang ............... H01L 29/78696
257/43

OTHER PUBLICATIONS

Nomura, Kenji, *Ambipolar Oxide Thin-Film Transistor*, Frontier Research Center, Tokyo Institute of Technology, Adv. Matter. 2011, vol. 23, pp. 3431-3434, published online: Jul. 1, 2011.

(Continued)

*Primary Examiner* — Matthew Landau
*Assistant Examiner* — Scott Stowe
(74) *Attorney, Agent, or Firm* — Blakely, Sokoloff, Taylor & Zafman LLP

(57) ABSTRACT

Embodiments of the invention include sulfur alloyed InGaZnO (IGZOS) thin film transistors (TFTs) and methods of making such devices. In one embodiment, the IGZOS TFT may include a substrate and a gate electrode formed over the substrate. A gate dielectric layer may be formed over the gate electrode. An IGZOS film may be formed over a surface of the gate dielectric. Additionally, embodiments of the invention include a source region and a drain region formed in contact with the IGZOS film. An opening between the source region and the drain region may define a channel region in the IGZOS film. Embodiments of the invention are able to form a p-type IGZO TFT by increasing the valence band of the IGZO material in order to eliminate the presence of trap states in the band gap. The valance band may be raised by doping the IGZO material with sulfur.

24 Claims, 10 Drawing Sheets

(56) References Cited

OTHER PUBLICATIONS

Nomura, Kenji, *Recent Progess of Oxide-Semiconductor-Based P-channel TFTs*, SID Symposium Digest of Technical Papers, Issue 1, San Jose, 2015; vol. 46, Issue 1, pp. 591-594, Jun. 2015.
Thankalekshmi, Ratheesh R., *Structure and optical band gap of $ZnO_{1-x}S_x$ thin films synthesized by chemical spray pyrolysis for application in solar cells*; Journal of Applied Physics; Published online Sep. 21, 2012; p. 112; vol. 112, No. 6; AIP Publishing.
Hekmatshoar, Bahman, *Novel Amorphous-Si AMOLED Pixels with OLED-independent Turn-on Voltage and Driving Current*; Device Research Conference, 2007, $65^{th}$ Annual; Jun. 18, 2007; pp. 95-96; IEEE.

* cited by examiner

METHOD AND APPARATUS FOR MAKING P-CHANNEL THIN FILM TRANSISTORS FOR OLED AND LED ACTIVE MATRIX FLAT PANEL DISPLAYS

FIELD OF THE INVENTION

Embodiments of the present invention relate generally to the manufacture of thin film transistors. In particular, embodiments of the present invention relate to P-channel thin film transistors and methods for manufacturing such devices.

BACKGROUND OF THE INVENTION

In Active Matrix Organic Light Emitting Diode (AMO-LED) displays, a voltage data signal is converted in the pixel to an OLED driving current (and thus brightness) by a thin film transistor (TFT). Conventional "bottom-anode (ITO)" OLEDs typically use p-channel devices, because only p-channel devices allow for the direct programming of the TFT gate-source voltage (and thus the driving current) independent of the OLED I-V curve. Accordingly, low-cost amorphous-Si (a-Si) and amorphous oxide semiconductor TFT technologies cannot currently be used in active matrix displays because no p-channel a-Si or amorphous oxide semiconductor device exists for fundamental reasons, which will be described in greater detail below. Therefore, more expensive materials, such as low temperature poly-Si (LTPS) must be used to form active matrix display devices.

Oxide semiconductor-based TFTs have attracted an increasing amount of attention due to their desirable characteristics, including high mobility, low-temperature process compatibility, and low fabrication cost. However, in oxide semiconductor-based TFTs (e.g., amorphous indium-gallium-zinc oxide (a-IGZO), indium-zinc-oxide (IZO), gallium-zinc-oxide (GaZnO), aluminum-zinc-oxide (AlZnO), zinc-oxide (ZnO), copper-oxide ($Cu_2O$), tin-oxide (SnO), nickel-oxide (NiO), copper-aluminum oxide ($CuAl_2O_4$), zinc-rhodium-oxide ($ZnRh_2O_4$), or the like), the electrical performance of p-type oxide TFTs is still inferior to that of n-type oxide TFTs. Specifically, it has been found that the electrical performance of p-type oxide-semiconductors is severely limited by the localized 2p orbitals in the valence band maximum (VBM), the deep VBMs, and self-compensation by donor impurities. Accordingly, it is currently not feasible to use oxide semiconductor-based TFTs in AMO-LED devices or other display technologies, such as Active Matrix Inorganic Light Emitting Diodes, micro LED Displays, or the like.

Accordingly, there is a need for p-channel oxide semiconductor thin film transistors.

DETAILED DESCRIPTION OF THE INVENTION

Described herein are systems that include oxide semiconductor TFTs and methods of forming such semiconductor devices. According to an embodiment, the oxide semiconductor may include an IGZOS alloy (i.e., IGZO alloyed with sulfur). However, it is to be appreciated that any suitable oxide semiconductor that responds favorably to alloying with sulfur may be used. For example, other suitable oxide semiconductors may include sulfur alloyed with IZO, GaZnO, AlZnO, ZnO, or the like. Accordingly, any reference to IGZOS herein may also refer to other sulfur-alloyed oxide semiconductor. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, IGZOS-TFTs (or any other suitable sulfur-alloyed oxide semiconductor) are able to be formed with low-temperature processes, such as reactive sputtering. For example, reactive sputtering processes may be performed below approximately 400° C. Such processing provides a significantly improved thermal budget compared to other deposition processes used to deposit other semiconductor materials. The combination of low processing temperatures, low cost processing, and high carrier mobility makes IGZOS-TFTs an extremely attractive candidate for display technologies. As such, IGZOS-TFTs may be included in display technologies (e.g., AMLED and AMO-LED displays).

Figure 1:
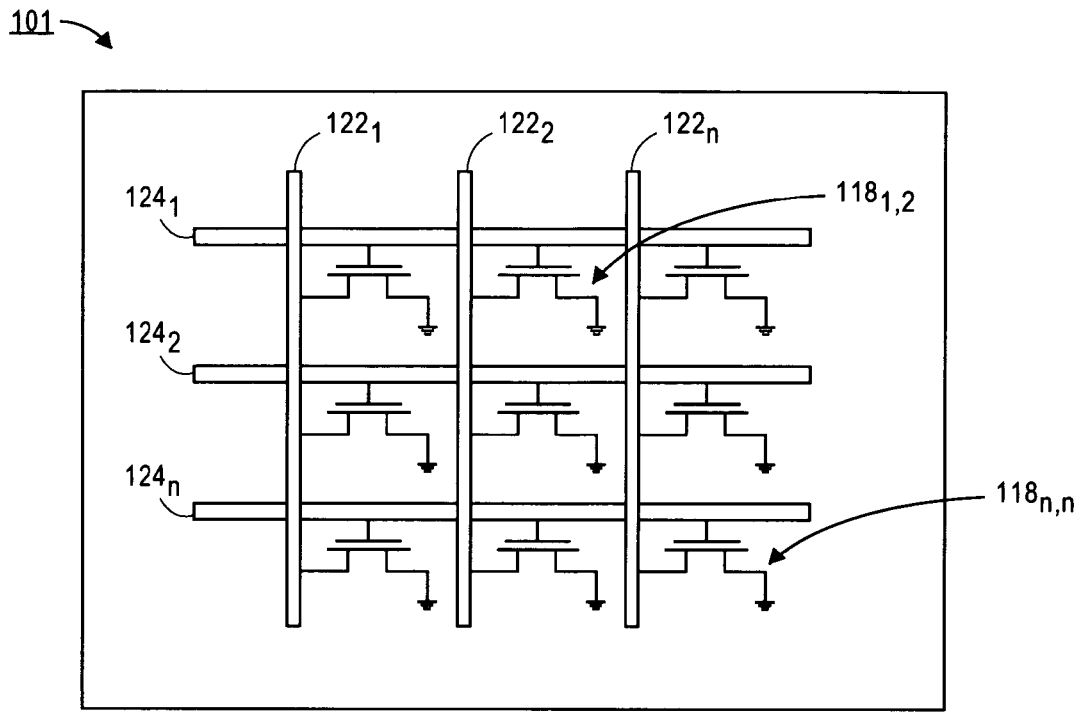
FIG. 1 is a schematic of a plurality of thin film transistor used in an active matrix display, according to an embodiment of the invention.

The use of IGZO-TFTs in display technology is shown schematically in FIG. 1. As shown, a plurality of IGZO-TFTs 118 may be positioned in an active matrix display 101, with each IGZO-TFT 118 controlling a different pixel of the display 101. In an active matrix display, an array of IGZO-TFTs $118_{1,1}$-$118_{n,n}$ may be individually addressed by applying the desired voltage to the gate contact of each IGZO-TFT in a row $124_1$-$124_n$ and by applying a desired source voltage to each IGZO-TFT via a data line $122_1$-$122_n$.

While the use of IGZO-TFTs in applications such as the one described above is desirable, there are still significant limitations to the inclusion of IGZO-TFTs formed with currently known processes. One such limitation is the lack of the ability to form functional p-type IGZO-TFTs. Display circuitry would desirably use p-type devices or a combination of p-type and n-type devices in order to improve the performance of the displays, as described above. However, p-type IGZO devices are currently not used because they have a low carrier mobility (i.e., hole mobility). Whereas an n-type device is able to form a sufficient number of donor impurities that readily provide a carrier (i.e., an electron) to the conduction band, the acceptor impurities in p-type devices are not as efficient at producing carriers (i.e., holes). It is believed that the reason acceptor impurities in the IGZO material do not improve hole concentration and mobility is because of the presence of a large number of trap states near the valance band edge.

Figure 2:
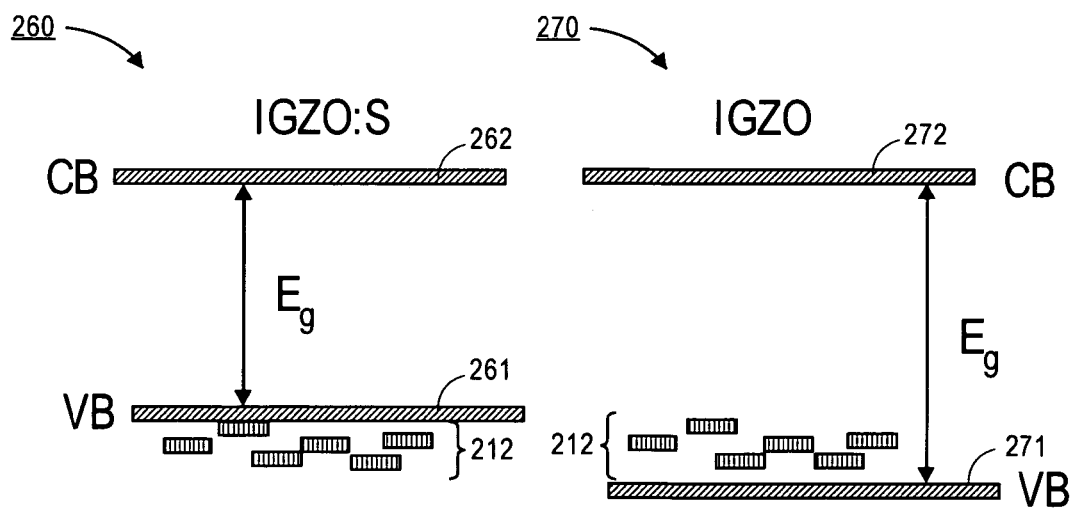
FIG. 2 is a band gap diagram of a sulfur alloyed InGaZnO (IGZOS) material compared to the band gap diagram of an InGaZnO (IGZO) material, according to an embodiment of the invention.

FIG. 2 provides a band gap diagram 270 of an IGZO material. The band gap diagram 270 illustrates the relative locations of the conduction band 272 and the valance band 271. The difference between the conduction band 272 and the valance band 271 is the band gap energy $E_g$. As illustrated, a plurality of trap states 212 are located slightly above the valance band 271. The trap states 212 reduce carrier mobility because they annihilate the dominate charge carrier (i.e., in a p-type device, the trap states 212 recombine with the holes formed by acceptor impurities). It is believed that the primary source of trap states above the valance band in IGZO materials is oxygen vacancies.

Accordingly, embodiments of the present invention are able to overcome these shortfalls in currently available IGZO devices by adjusting the valance band of the IGZO material, as illustrated in the band gap diagram 260. In an embodiment, the valance band is increased above the trap states 212 by alloying the IGZO material with sulfur. For example, the IGZO:Sulfur alloy may account for sulfur between approximately 30% and 50% of the volume of the IGZOS material. Raising the valance band above the trap states 212 allows for the trap states to no longer compensate for the acceptor dopants. By way of example, raising the valance band by between approximately 0.5-0.7 eV is believed to eliminate or significantly reduce the trap states in the band gap proximate to the valance band edge 261. As illustrated in FIG. 2, raising the valance band 261 may not alter the conduction band 262. Accordingly, the band gap $E_g$ may be reduced slightly. However, due to the already large band gap of IGZO, the decrease does not significantly reduce the benefits provided by a IGZOS transistor.

According to an embodiment, any tradeoff in reduced band gap energy $E_g$ may be compensated for by the increase in carrier concentration made possible by removing the trap states 212 from the band gap. For example, removing the trap states 212 from the band gap allows for holes to be formed at a sufficiently high concentration to provide the desired hole mobility. For example, embodiments of the invention may include a hole concentration in the range of $10^{12}$-$10^{15}$ cm$^{-3}$ and a hole mobility that may be approximately 5 cm$^2$/V-s or greater. Accordingly, embodiments of the invention are able to form high performance p-type IGZOS-TFTs.

Furthermore, it is to be appreciated that the sulfur doping only alters the valence band. As such, the concentration of acceptor impurities does not significantly increase as a result of sulfur doping. However, embodiments of the invention may also include doping the IGZO with p-type dopants. For example, the p-type dopants may be approximately 1% or less of the volume of the film. The use of p-type dopants increases the concentration of acceptor impurities, and therefore, may also improve the concentration and mobility of the carriers.

Figure 3:
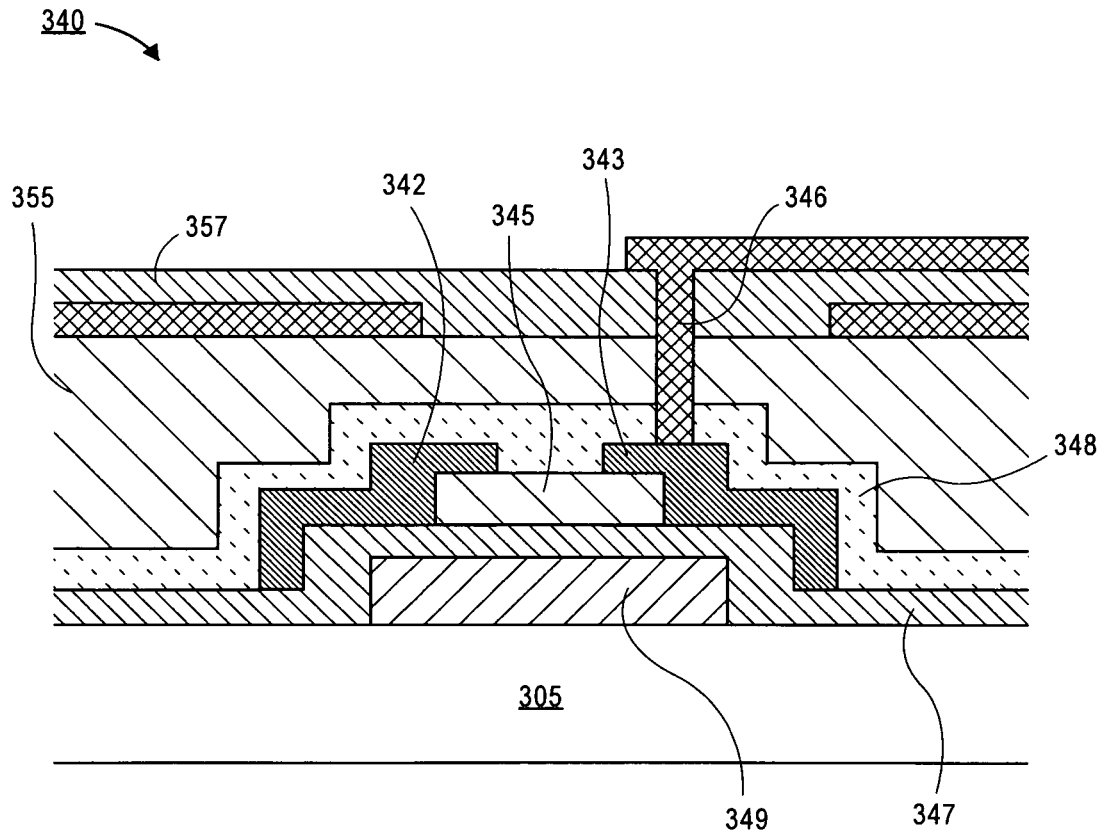
FIG. 3 is a cross-sectional illustration of a p-type IGZOS thin film transistor, according to an embodiment of the invention.

Referring now to FIG. 3, a cross-sectional illustration of a p-type IGZOS-TFT 340 is shown according to an embodiment of the invention. According to an embodiment, the p-type IGZOS-TFT 340 may be formed over a substrate 305. Embodiments may include a substrate 305 that is a glass substrate or any other rigid substrate typically used in display technologies. Furthermore, the low temperature processing operations described in greater detail below, allow for embodiments of the invention to include forming the p-type IGZOS-TFT 340 on any substrate material. In one embodiment, the substrate 305 may be an interlayer dielectric (ILD) in a BEOL stack. Embodiments of the invention may also include polymeric substrates 305. A polymeric substrate 305 may be a rigid or a flexible material. Forming the p-type IGZOS-TFT 340 on a flexible substrate 305 provides even greater freedom in design and may allow for inclusion of the p-type IGZOS-TFT 340 on wearable devices that are conformable to the user (e.g., watches, biomedical sensors, or the like).

According to an embodiment, a gate electrode 349 may be formed over a surface of the substrate 305. In some embodiments, a buffer layer (not shown) may separate the gate electrode 349 from the substrate. The gate electrode 349 and may consist of at least one p-type workfunction metal. In some embodiments, the gate electrode 349 may consist of a stack of two or more metal layers, where one or more metal layers are workfunction metal layers and at least one metal layer is a fill metal layer.

For a p-type IGZOS-TFT 340, metals that may be used for the gate electrode include, but are not limited to, ruthenium, palladium, platinum, cobalt, nickel, and conductive metal oxides, e.g., ruthenium oxide. A p-type metal layer will enable the formation of a PMOS gate electrode with a workfunction that is between about 4.9 eV and about 5.2 eV.

In an embodiment, a gate dielectric layer 347 may be formed over a surface of the gate electrode 349. According to an embodiment, the gate dielectric layer 347 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. In some embodiments, an annealing process may be carried out on the gate dielectric layer 347 to improve its quality when a high-k material is used.

According to an embodiment, an oxide semiconductor channel 345 may be formed over the gate dielectric layer 345. According to an embodiment of the invention, the oxide semiconductor channel 345 is alloyed with sulfur. Alloying the oxide semiconductor channel 345 with sulfur increases the valance band of the material. The oxide semiconductor channel 345 may be alloyed with a sufficient volume percentage of sulfur to raise the valance band above a high concentration of trap states. For example, the volume percentage of sulfur may be between approximately 30% and 50% of the overall volume of the oxide semiconductor channel 345. In some embodiments, the valance band may be increased by between approximately 0.5 eV and 0.7 eV by being alloyed with sulfur. In one particular embodiment, the semiconductor oxide channel 345 may be an IGZOS material. Alternative embodiments may include an oxide semiconductor channel 345 that is any suitable material that responds favorable (i.e., the valence band of the material increases above a high density of trap states) when alloyed with sulfur. By way of example, the oxide semiconductor channel 345 may be IZO, GaZnO, AlZnO, or ZnO. Additional embodiments may also include doping the semiconductor oxide channel 345 to produce a p-type device. For example, when the semiconductor oxide channel 345 is IGZOS, p-type dopants may include, but are not limited to As, N, Cu, and P. By way of example, the p-type dopants may account for approximately 1% or less of the volume of the oxide semiconductor channel 345.

According to an embodiment, a source region 342 and a drain region 343, may be formed on opposite ends of the channel region 345. The source region and drain region 342/343 contact the channel region 345. The contact with the channel region may be formed over a top surface of the channel region 345, a sidewall of the channel region 345, or a combination thereof. The source region 342 and the drain region 343 may be any suitable conductive material. For example, the source and drain regions 342/343 may be tungsten, aluminum, copper, alloys of metals, or the like. In some applications, source and drain regions 342/343 may be transparent. Transparent source and drain regions 342/343 may be used in display applications. As such, embodiments may include any transparent conductive material, such as, for example, indium-tin-oxide (ITO).

Embodiments of the invention may also include a passivation layer 348 formed over the exposed portions of the channel region 345, the source region 342, the drain region 343, and the gate dielectric 347. The passivation layer 348 may be any insulating material. For example, the passivation layer 348 may be an oxide or nitride, such as silicon or aluminum-based oxides and nitrides. In display applications it may be desirable to include a transparent passivation layer 345.

Embodiments of the invention may also include one or more insulating layers 335 and routing layers 357. According to an embodiment, the routing layer 357 may include conductive lines and vias 346 for forming electrical contacts to one or more of the source region 342, the drain region 343, and the gate electrode 349.

While extensive discussion herein is directed to p-type oxide semiconductor TFTs, embodiments of the invention are not so limited. Accordingly, embodiments of the invention may also include n-type oxide semiconductor TFTs. n-type oxide semiconductor TFTs may also utilize sulfur alloying similar to the p-type devices described herein, with the exception that the channel region 345 also be doped with n-type dopants instead of p-type dopants. For example, in an IGZOS material, n-type dopants may include nitrogen or the like. The ability to form n-type and p-type oxide semiconductor TFTs that are alloyed with sulfur may allow for more complex circuitry to be formed, such as, for example, complementary metal-oxide-semiconductors (CMOS) devices.

Additionally, embodiments of the invention may include a gate electrode 359 in the n-type oxide semiconductor TFT that provides an n-type workfunction. For example, metals that may be used for the n-type gate electrode 359 may include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An n-type metal layer will enable the formation of an NMOS gate electrode with a workfunction that is between about 3.9 eV and about 4.2 eV.

Embodiments of the invention also include several different processing procedures that may be used to form a sulfur alloyed oxide semiconductor film. As described in detail herein, an IGZOS film is formed, though embodiments of the invention are not limited and substantially similar processing may be implemented in order to form other sulfur alloyed oxide semiconductor films, such as those described above. A first process according to an embodiment of the invention may include a reactive sputtering process that is described with respect to FIGS. 4A and 4B.

Figure 4A:
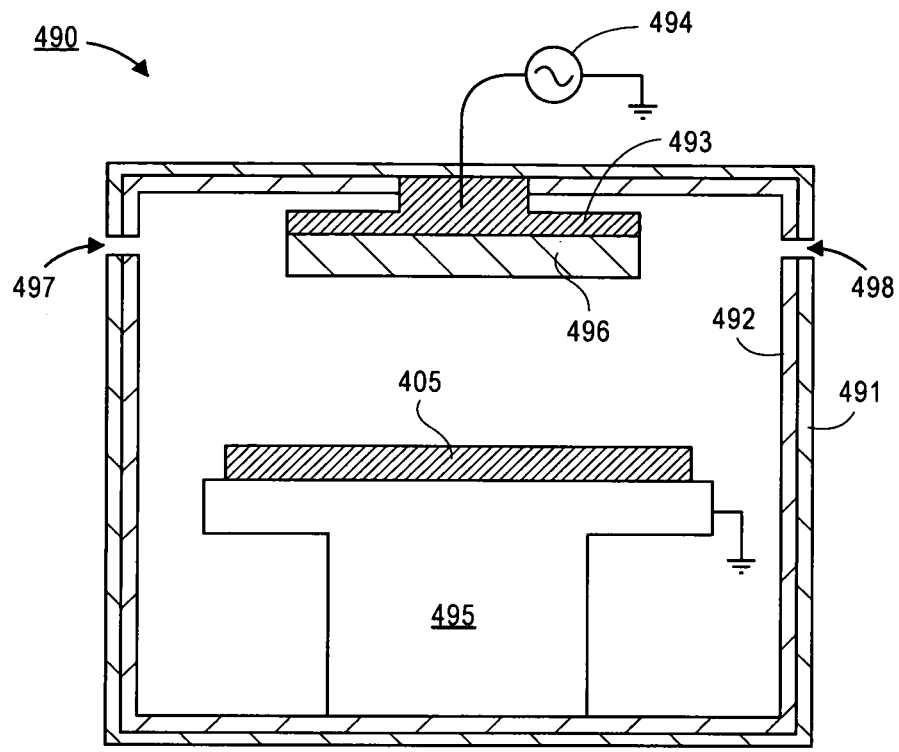
FIG. 4A is a cross-sectional illustration of a chamber used for forming an IGZOS film on a substrate, according to an embodiment of the invention.

Referring now to FIG. 4A, a cross-sectional illustration of a processing chamber 490 is shown according to an embodiment of the invention. The processing chamber 490 may be a vacuum chamber that includes chamber walls 491. In an embodiment, the sputtering process to deposit the IGZO film is a reactive sputtering process. As such, one or more gas inlets 497 may be formed through the chamber wall 491 in order to allow for the reactive gas and other processing gasses to be flown into the chamber during processing. An exhaust opening 498 may also be formed through the chamber wall 491 to allow for byproduct removal and venting the chamber 490.

In addition to the inlets/outlets 497/498, the chamber 490 may include a substrate support 495 for holding a substrate 405 during processing. According to an embodiment the substrate support 495 may be an electrostatic chuck. Additional embodiments may include a temperature controlled support 495. For example, the support 495 may include one or more cooling and/or heating zones to ensure uniform deposition of the film across the surface of the substrate 405.

Embodiments of the invention may also include one or more target supports 493 for securing one or more targets 496. According to an embodiment the target support may be coupled to a power supply 494. For example, the power supply 494 may be an alternating current (AC) power supply in order to aid in the deposition of the material dislodged from the target 496 onto the substrate 405. According to an embodiment, a single target 496 that includes an alloyed material with all of the needed materials to form the IGZO layer may be used. Alternative embodiments may include a plurality of targets that include different materials that may be combined on the substrate to form the IGZO layer.

Embodiments of the invention include alloying the deposited IGZO layer with a reactive sputtering process that uses a reactive gas that includes sulfur. By way of example, the reactive gas may be a hydrogen sulfide gas ($H_2S$). The $H_2S$ disassociates during the reactive sputtering process, and the freed sulfur may be deposited on the substrate 405 along with the particles ejected from the target by the plasma. Embodiments of the invention may include a processing gas mix that includes inert gasses to form the plasma in combination with the reactive gas. By way of example, the reactive gas may be approximately 5% of the gas volume in the chamber or less during the reactive sputtering process.

Furthermore, it is to be appreciated that sulfur is a corrosive material. Accordingly, embodiments of the invention may implement the reactive sputtering process in a chamber 490 that includes a protective coating 492 along the sidewalls 491. Additional embodiments may include forming the protective coating over all exposed surfaces (e.g., the substrate support 495 and the target support 493) in the chamber 490 in order to increase the time between repairs or decommission of the chamber. In one embodiment, the protective coating 492 is an annealed and low-carbon stainless steel. For example, the protective coating 492 may include 300-series stainless steel or an austenite nickel-chromium based alloy.

Figure 4B:
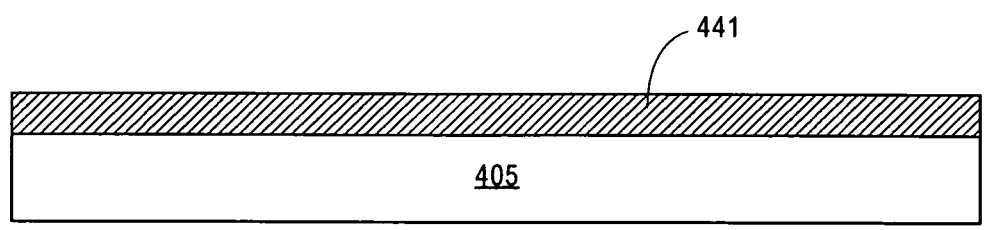
FIG. 4B is a cross-sectional illustration the IGZOS film formed on a substrate, according to an embodiment of the invention.

Referring now to FIG. 4B, a cross-sectional view of a substrate 405 after a IGZOS film 441 is deposited over the surface with a reactive sputtering process is shown according to an embodiment of the invention. As described above, the reactive sputtering process may be a low temperature process (e.g., approximately 400° C. or less). Accordingly, the substrate 405 may be any substrate material, such as those described above. In an embodiment, the IGZOS film may have a thickness that is less than 50 nm. Additional embodiments include a thickness that is less than approximately 10 nm. Embodiments of the invention include a sulfur concentration that is approximately 30%-50% of the volume of the film.

Figure 8A:
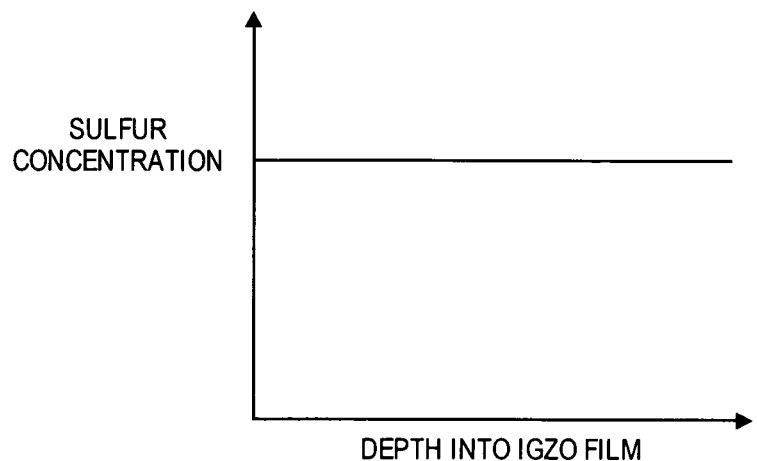
FIGS. 8A-8C are graphs that illustrate various sulfur concentrations with respect to depth in an IGZOS film, according to an embodiment of the invention.
Figure 8B:
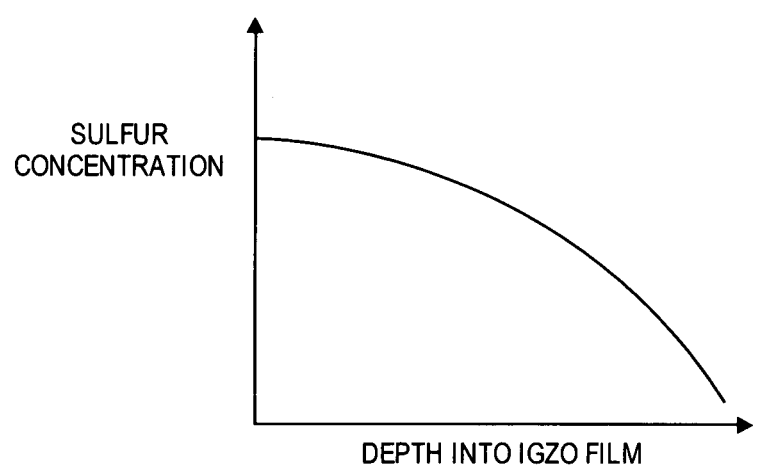
Figure 8C:
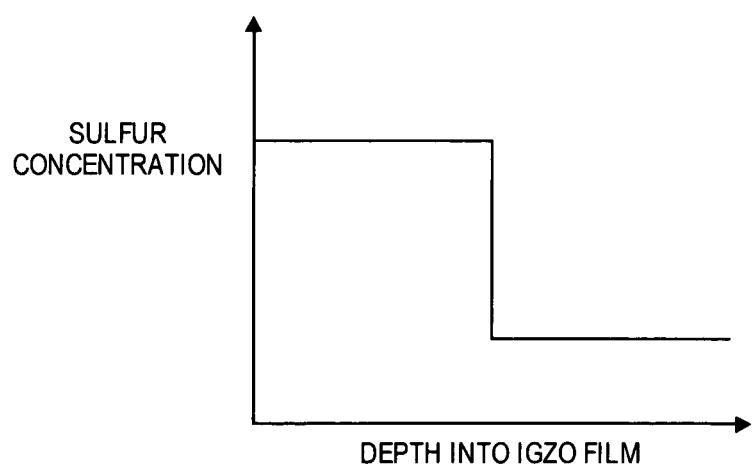

Furthermore, it is to be appreciated that since the sulfur is deposited on the substrate at the same time the IGZO is deposited with the sputtering process, the concentration of sulfur throughout the thickness of the film may be highly controllable. For example, increasing, decreasing, or ceasing the flow of $H_2S$ into the chamber may alter the concentration of sulfur in the film. In one embodiment, a consistent concentration of sulfur is maintained throughout the thickness of the film. For example, FIG. 8A illustrates a concentration gradient according to such an embodiment. Additional embodiments may include an increasing or decreasing concentration of sulfur throughout the thickness of the film. For example, FIG. 8B shows a concentration gradient of sulfur that is highest at the top surface of the film and decreases toward the substrate 405. While a non-linear concentration gradient is shown in FIG. 8B, it is to be appreciated that a reactive sputtering process may be controlled to provide a substantially linear concentration gradient as well. Additional embodiments may also include a sulfur concentration gradient that is stepped, as illustrated in FIG. 8C. For example, a step in the concentration of sulfur may be obtained by rapidly increasing or decreasing the flow of $H_2S$ into the chamber and then maintaining the increased or decreased flow rate. Such embodiments may be beneficial when a dual band gap structure is desired (e.g., to form a quantum well).

According to an additional embodiment, the sulfurization may be implemented in the chamber 490 after the IGZO film is deposited. In such an embodiment, the chamber may be filled with $H_2S$ and an elevated temperature may be maintained to allow for diffusion of the sulfur species into the previously deposited IGZO film. Accordingly, embodiments of the invention may allow for a deposition and sulfurization process to be implemented in the same chamber. Alternatively, the substrate 405 may be removed from the deposition chamber and placed in a sulfurization chamber in order to form the alloyed IGZOS film. Such an embodiment may be beneficial because the chamber 490 may not need to be protected from the corrosive species since a dedicated sulfurization chamber may be used.

Figure 5A:
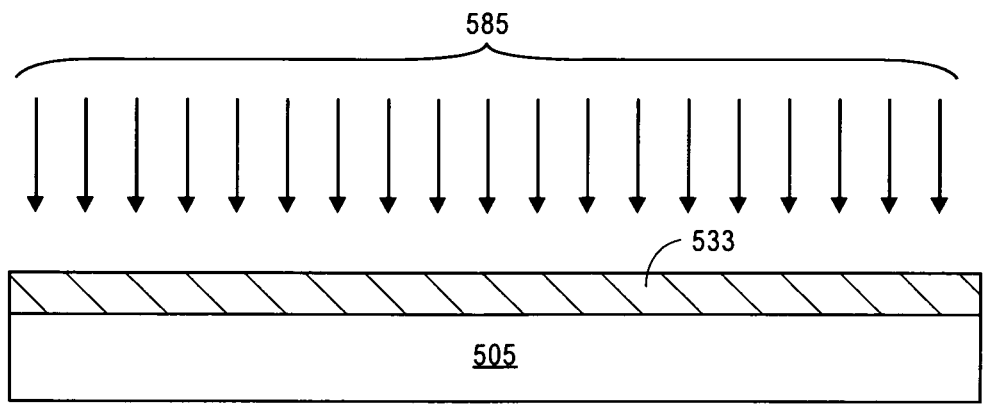
FIG. 5A is a cross-sectional illustration sulfur being ion implanted into an IGZO film, according to an embodiment of the invention.
Figure 5B:
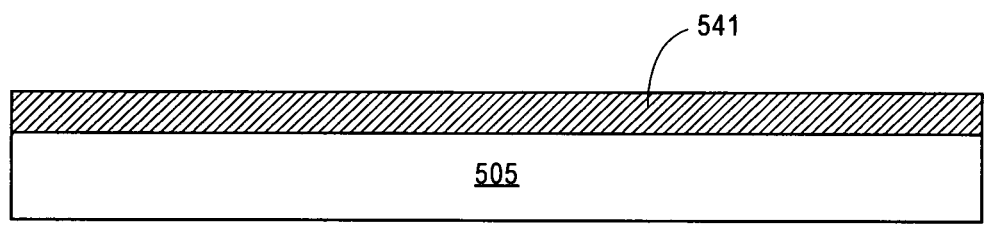
FIG. 5B is a cross-sectional illustration of a IGZOS film formed on a substrate, according to an embodiment of the invention.

Referring now to FIG. 5A, a cross-sectional illustration of IGZO film 533 that is in the process of being alloyed with sulfur is shown according to an embodiment of the invention. In the illustrated embodiment, the IGZO film 533 may be deposited with any suitable deposition process, such as PVD. After the IGZO film 533 is formed, the film may be alloyed with sulfur using an ion implantation process. Implanting sulfur ions 585 into the surface of the IGZO allows for low temperature formation of the IGZOS film 541 shown in FIG. 5B. Additionally, ion implantation allows for control of the sulfur concentration gradient. For example, the sulfur ions 585 may be implanted at any desired depth by controlling the implantation energy. As such, any desired concentration gradient (e.g., any of the gradients illustrated in FIGS. 8A-8C or the like) may be obtained.

Figure 6A:
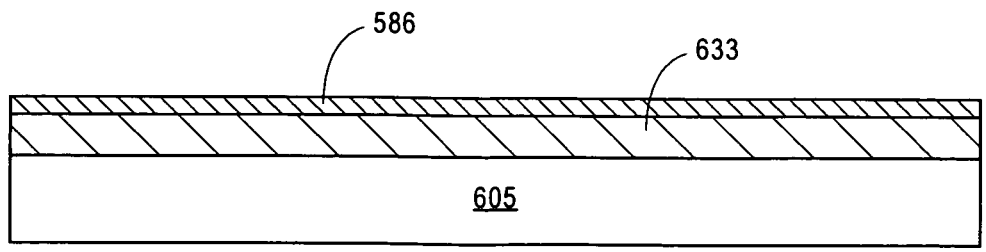
FIG. 6A is a cross-sectional illustration of an IGZO film formed over a substrate and a sulfur source formed over a top surface of the IGZO film, according to an embodiment of the invention.
Figure 6B:
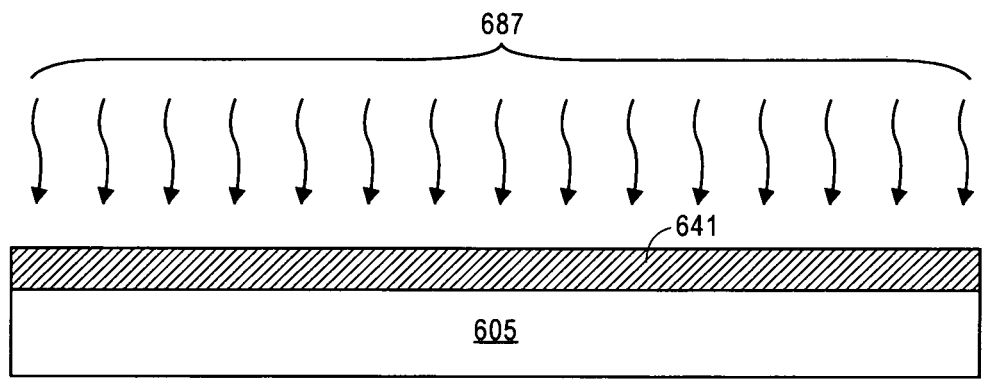
FIG. 6B is a cross-sectional illustration of the device in FIG. 6A after thermal energy is applied to initiate diffusion of the sulfur into the IGZO film to form a IGZOS film, according to an embodiment of the invention.

Referring now to FIGS. 6A and 6B, a thermal diffusion process used to form the IGZOS film is illustrated, according to an additional embodiment of the invention. According to an embodiment, a thermal diffusion process may include forming a solid film 686 containing sulfur over the IGZO film 633, as illustrated in FIG. 6A. In an alternative embodiment a liquid or gel containing sulfur may be deposited over the IGZO film 633 instead of a solid film 686.

Referring now to FIG. 6B, thermal energy 687 is applied to the films in order to drive diffusion of the sulfur 686 into the IGZO film 633. While the thermal energy 687 is illustrated as being applied from above, it is to be appreciated that a substrate support may provide thermal energy to drive the diffusion between the films. For example, the substrate 605 may be heated on a hot plate. Since the IGZO film 633 is a thin film, the thermal process may be able to form a uniform sulfur distribution, similar to the distribution illustrated in FIG. 8A. Alternatively, a gradient similar to the one shown in FIG. 8B with a top surface of the doped IGZO film 641 having a greater concentration of sulfur than a lower surface of the doped IGZO film 641 may be formed.

Figure 7:
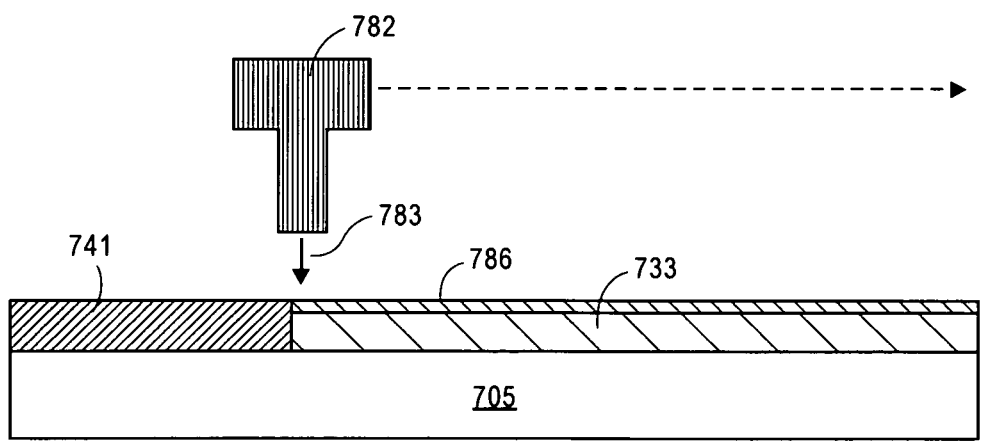
FIG. 7 is a cross-sectional illustration of a laser assisted diffusion process that forms an IGZOS film, according to an embodiment of the invention.

Referring now to FIG. 7, a cross-sectional illustration of a laser assisted diffusion of sulfur 786 into the IGZO film 733 is shown according to an embodiment of the invention. According to an embodiment, a solid or liquid sulfur containing film 786 may be formed over the top surface of the IGZO film 733. A laser 782 (e.g., a $CO_2$ laser, an ultra violet (UV) laser, or the like) may pass over the top surface and apply pulses 783 of laser energy to the films. For example, the pulses may be nanoseconds to milliseconds in duration. This short duration may provide sufficient energy to the films to drive diffusion of sulfur 386 into the IGZO film 733 to form a IGZOS film 741. As the laser travels across the surface, as indicated by the arrow, the entire IGZO layer 733 may be doped to form a IGZOS layer 741. Furthermore, the number of passes, the energy of the pulses 783, and the duration of the pulses 783 may be controlled in order to provide a desired sulfur concentration gradient, similar to those shown in FIGS. 8A-8C, or any other desired gradient.

Figure 9A:
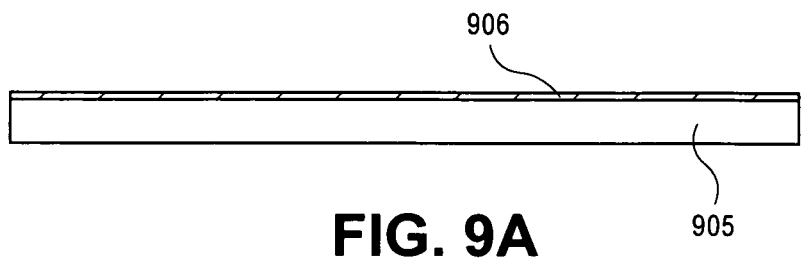
FIGS. 9A-9F are cross-sectional illustrations of various processing operations used to form an IGZOS thin film transistor, according to an embodiment of the invention.
Figure 9B:
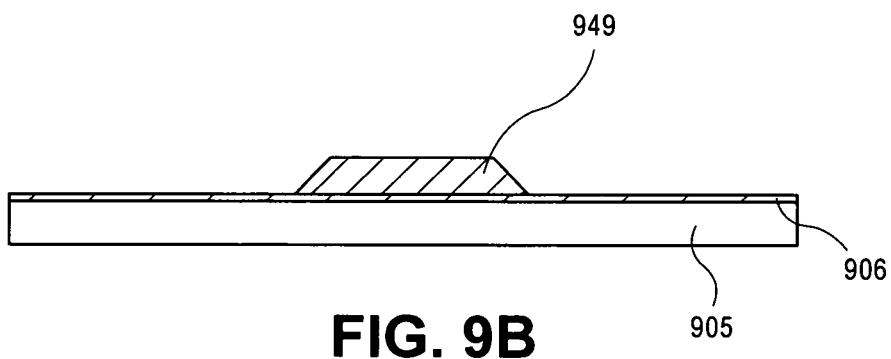
Figure 9C:
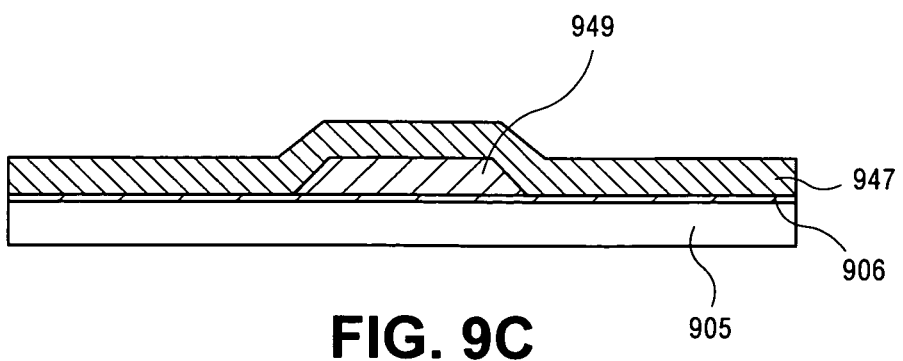
Figure 9D:
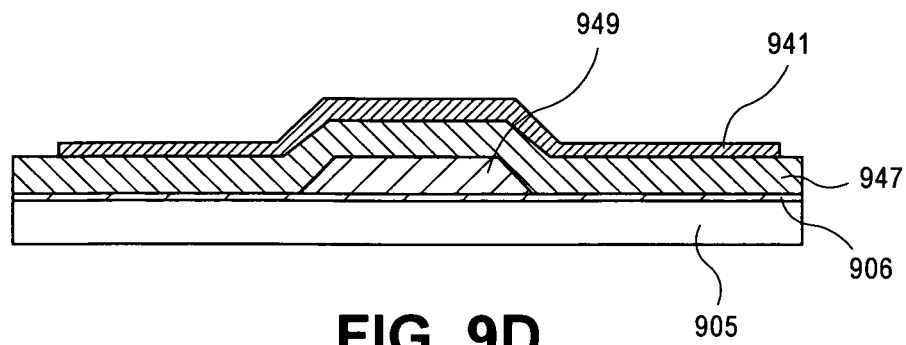
Figure 9E:
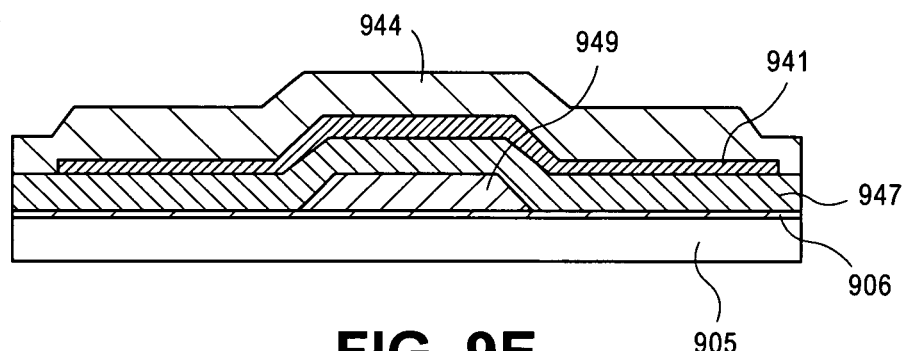
Figure 9F:
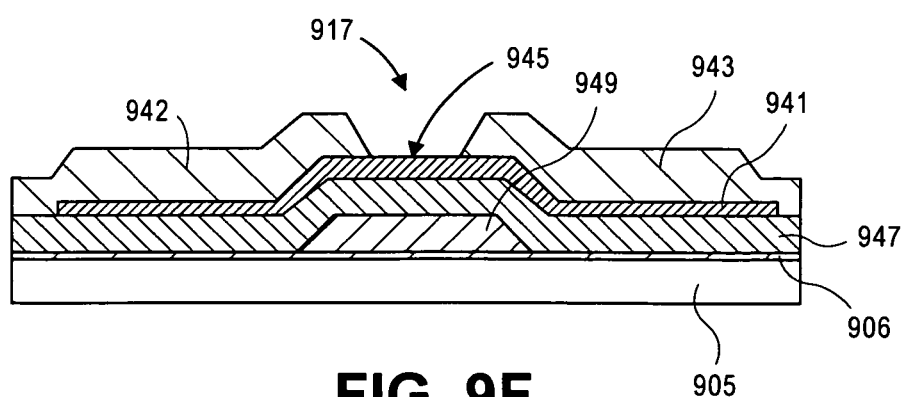
Figure 10:
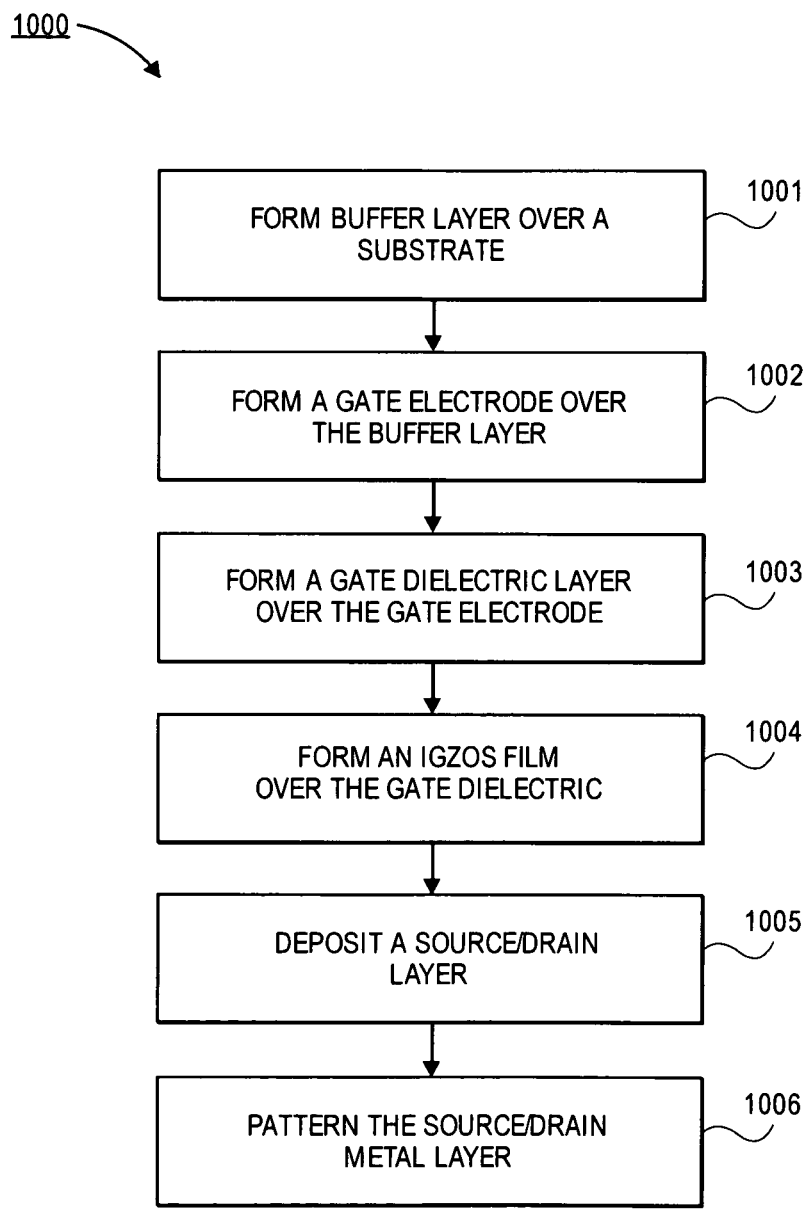
FIG. 10 is a flow chart that describes a process used to form a IGZOS thin film transistor, according to an embodiment of the invention.

Referring now to FIG. 9A-9F and the flow chart in FIG. 10, a process-flow 1000 for forming a p-type IGZOS-TFT is shown and described according to an embodiment of the invention.

Referring now to operation 1001, embodiments of the invention include forming a buffer layer 906 over a substrate 905. For example, in FIG. 9A a cross-sectional illustration of a buffer layer 906 formed over a substrate 905 is shown according to an embodiment of the invention. The buffer layer 906 may be blanket deposited over the surface of the substrate 905. For example, the buffer layer 906 may be deposited with a PVD or CVD process. According to an embodiment of the invention, the buffer layer 906 may be an oxide or a nitride. By way of example, the buffer layer 906 may be silicon dioxide ($SiO_2$).

Next, embodiments of the invention may proceed to operation 1002 that includes forming a gate electrode 949 over the buffer layer 906. As shown in FIG. 9B, a gate electrode 949 has been formed over the buffer layer 906. According to an embodiment, a conductive material used to form the gate electrode 949 may be blanket deposited (e.g., with a sputtering process) over the buffer layer 906. The blanket conductive layer may then be patterned to form the gate electrode 949. For example, the conductive layer may be patterned using photolithographic patterning and etching processes known in the art.

According to an embodiment, process 1000 may continue with operation 1003 that includes forming a gate dielectric layer 947 over the gate electrode 949. For example, FIG. 9C illustrates a conformal gate dielectric layer 947 formed along all exposed surfaces of the gate electrode 949. According to an embodiment, the gate dielectric layer 947 may be deposited with a blanket deposition process. As such, the gate dielectric layer 947 may also extend over portions of the buffer layer 906.

According to an embodiment, process 1000 may continue with operation 1004 that includes depositing an IGZOS layer 941 over a top surface of the gate dielectric layer 947. An IGZOS layer 941 is illustrated in FIG. 9D. According to an embodiment, the IGZOS layer 941 may be formed with any of the processing operations described in detail above. For example, the IGZOS layer 941 may be formed with a reactive sputtering process, a sulfurization process, a solid-state diffusion process, an ion implantation process, a laser assisted diffusion process, or the like. According to an embodiment, the IGZOS layer 941 may include a sulfur concentration that is between approximately 30% and 50% of the overall volume of the layer. Additionally, embodiments of the invention may include a sulfur concentration that varies with depth into the IGZOS layer 941. For example, the sulfur concentration may be increasing with depth, decreasing with depth, or include a stepped concentration. Processes for forming sulfur concentration gradients in the IGZOS layer 941 are described above, and therefore will not be repeated in detail here.

According to an embodiment, process 1000 may continue with operation 1005 that includes forming a conductive source/drain layer 944 over the IGZOS layer 941. As illustrated in FIG. 9E, the source/drain layer 944 may be blanket deposited and cover the entire top surface of the IGZOS layer 941. The source/drain layer 944 may be any suitable conductive material, such as copper, aluminum, tungsten, ITO, or the like. In an embodiment the source/drain layer 944 may be formed with any suitable conductive deposition process, such as sputtering, or the like.

According to an embodiment, the process 1000 may continue with operation 1006 that includes patterning the source/drain layer 944 to define a source region 942 and a drain region 943. As illustrated in FIG. 9F, the patterning process may form an opening 917 between the source region 942 and the drain region 943. The opening 917 exposes a portion of the IGZOS layer that is considered the IGZOS channel region 945.

After the channel region has been defined, one or more additional processing operations may be implemented to form a passivation layer (not shown) and any needed oxide layers, routing layers, and contacts. For example, an IGZOS-TFT may be completed to look substantially similar to the device illustrated in FIG. 3.

Figure 11:
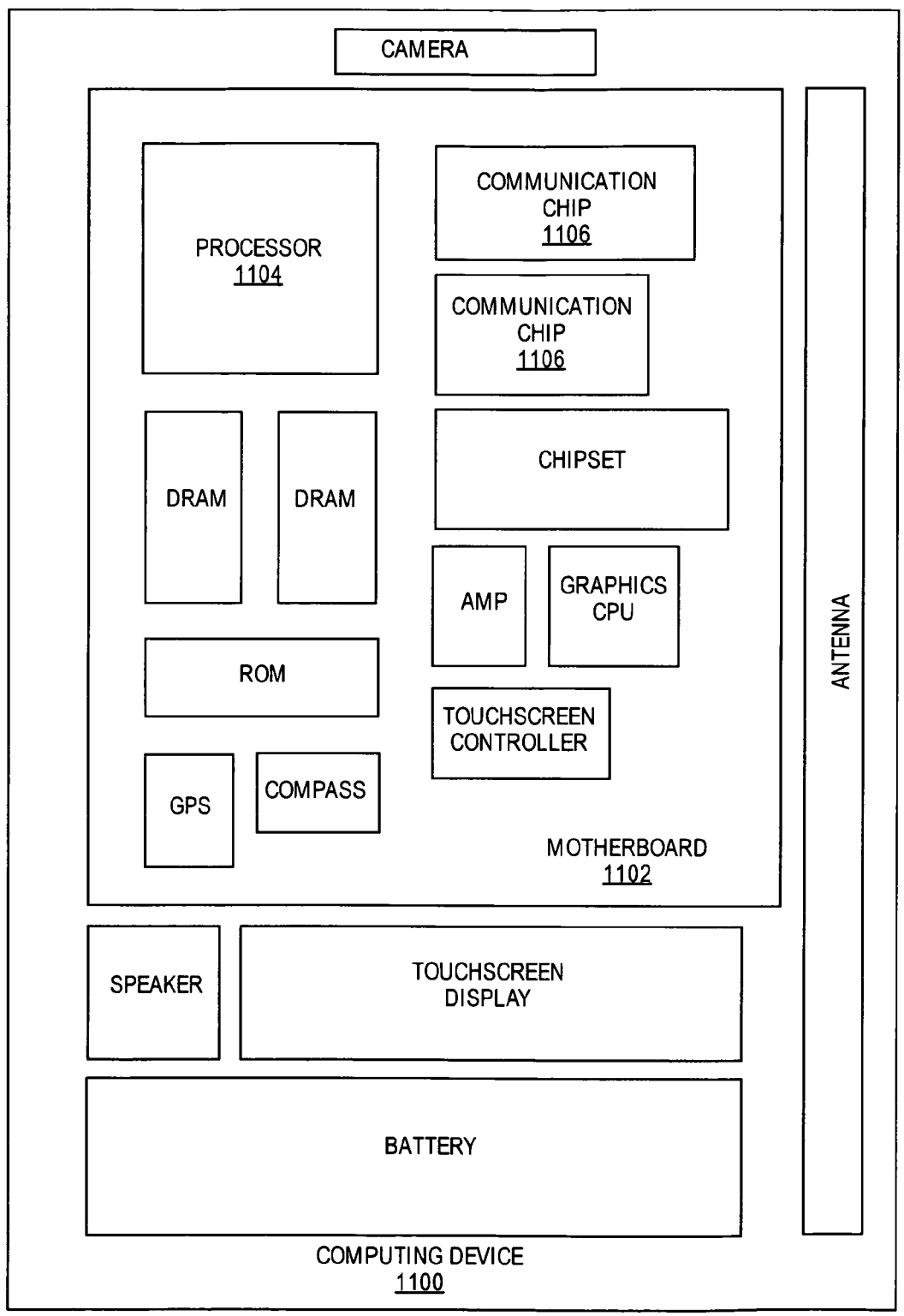
FIG. 11 is a schematic of a computing device built in accordance with an embodiment of the invention.

FIG. 11 illustrates a computing device 1100 in accordance with one implementation of the invention. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of the invention, the integrated circuit die of the processor may include one or more p-type IGZOS-TFTs, in accordance with implementations of the invention. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In accordance with another implementation of the invention, the integrated circuit die of the communication chip may include one or more p-type IGZOS-TFTs, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a semiconductor device, comprising: a substrate; a gate electrode formed over the substrate; a gate dielectric layer formed over the gate electrode; a sulfur alloyed InGaZnO (IGZOS) film formed over a surface of the gate dielectric; and a source region and a drain region formed in contact with the IGZOS film, wherein an opening between the source region and the drain region defines a channel region in the IGZOS film.

Additional embodiments of the invention include a semiconductor device, wherein the channel region is doped with p-type dopants.

Additional embodiments of the invention include a semiconductor device, wherein the p-type dopants include As, N, Cu, or P.

Additional embodiments of the invention include a semiconductor device, wherein the channel region is doped with n-type dopants.

Additional embodiments of the invention include a semiconductor device, wherein a sulfur concentration in the IGZOS film varies over the thickness of the film.

Additional embodiments of the invention include a semiconductor device, wherein the sulfur concentration is a stepped concentration.

Additional embodiments of the invention include a semiconductor device, wherein the sulfur concentration at a top surface of the IGZOS film is greater than the sulfur concentration at a bottom surface of the IGZOS film.

Additional embodiments of the invention include a semiconductor device, wherein the sulfur concentration has a substantially linear gradient between the top surface of the IGZOS film and the bottom surface of the IGZOS film.

Additional embodiments of the invention include a semiconductor device, wherein the substrate is a glass substrate.

Additional embodiments of the invention include a semiconductor device, wherein the glass substrate is a substrate in a display device.

Additional embodiments of the invention include a semiconductor device, wherein the sulfur concentration is between 30% and 50% of the volume of the IGZO film.

Embodiments of the invention include a method of forming a sulfur alloyed InGaZnO (IGZOS) film comprising: placing a substrate in a reactive sputtering chamber, wherein the reactive sputtering chamber comprises an IGZO target and an inlet for flowing a reactive species containing sulfur; and flowing the reactive species into the chamber as the IGZO target is used to sputter a film over the substrate, wherein the sulfur in the reactive species deposits into the IGZO film as the IGZO film is deposited on the substrate.

Additional embodiments of the invention include a method of forming an IGZOS, further comprising: increasing the flow-rate of the reactive species over time.

Additional embodiments of the invention include a method of forming an IGZOS, wherein the flow-rate of the reactive species is ramped up or down at a point during the sputtering process.

Additional embodiments of the invention include a method of forming an IGZOS, wherein the chamber includes a corrosion resistant coating along the chamber walls.

Embodiments of the invention include a method of forming a sulfur alloyed InGaZnO (IGZOS) film, comprising: depositing a IGZO film over a surface of a substrate; and doping the IGZO film with a sulfur source.

Additional embodiments of the invention include a method of forming an IGZOS, wherein the sulfur source is sulfur ions.

Additional embodiments of the invention include a method of forming an IGZOS, wherein the sulfur ions are implanted into the IGZO film with an ion implantation device.

Additional embodiments of the invention include a method of forming an IGZOS wherein the sulfur source is a sulfur gas, and wherein the sulfur gas is diffused into the IGZO film with a sulfurization process.

Additional embodiments of the invention include a method of forming an IGZOS, wherein the sulfur source is a sulfur containing film deposited over the IGZO film, and wherein doping the IGZO film comprises applying thermal energy to the IGZO film to initiate solid state diffusion.

Additional embodiments of the invention include a method of forming an IGZOS, wherein the thermal energy is provided by laser pulses from a laser.

Embodiments of the invention include a method of forming a p-type InGaZnO (IGZOS) based thin-film-transistor, comprising: forming a gate electrode over a substrate; forming a gate dielectric layer over the gate electrode; forming an IGZOS film layer over the gate dielectric layer; depositing a source/drain layer over the IGZOS film; and patterning the source/drain layer to form a source region and a drain region, wherein an opening between the source region and the drain region defines a channel region in the IGZOS film.

Additional embodiments of the invention include a method of forming a p-type IGZOS based thin-film-transistor, wherein the IGZOS film is formed with a reactive sputtering process, an ion implantation process, a sulfurization process, a thermal diffusion process, or a laser assisted diffusion process.

Additional embodiments of the invention include a method of forming a p-type IGZOS based thin-film-transistor, wherein a maximum temperature does not raise above approximately 400° C. during the formation of the IGZOS film.

Additional embodiments of the invention include a method of forming a p-type IGZOS based thin-film-transistor, wherein the p-type IGZOS thin-film-transistor is formed on a glass substrate used that is used in a display device.

What is claimed is:

1. A semiconductor device, comprising:
   a substrate;
   a gate electrode formed over the substrate;
   a gate dielectric layer formed over the gate electrode;
   a sulfur alloyed InGaZnO (IGZOS) film formed over a surface of the gate dielectric, wherein the sulfur concentration is between 30% and 50% of the volume of the IGZOS film; and
   a source region and a drain region formed in contact with the IGZOS film, wherein an opening between the source region and the drain region defines a channel region in the IGZOS film.

2. The semiconductor device of claim 1, wherein the channel region is doped with p-type dopants.

3. The semiconductor device of claim 2, wherein the p-type dopants include As, N, Cu, or P.

4. The semiconductor device of claim 1, wherein the channel region is doped with n-type dopants.

5. The semiconductor device of claim 1, wherein a sulfur concentration in the IGZOS film varies over the thickness of the film.

6. The semiconductor device of claim 5, wherein the sulfur concentration is a stepped concentration.

7. The semiconductor device of claim 5, wherein the sulfur concentration at a top surface of the IGZOS film is greater than the sulfur concentration at a bottom surface of the IGZOS film.

8. The semiconductor device of claim 7, wherein the sulfur concentration has a substantially linear gradient between the top surface of the IGZOS film and the bottom surface of the IGZOS film.

9. The semiconductor device of claim 1, wherein the substrate is a glass substrate.

10. The semiconductor device of claim 9, wherein the glass substrate is a substrate in a display device.

11. A method of forming a sulfur alloyed InGaZnO (IGZOS) film comprising:
    placing a substrate in a reactive sputtering chamber, wherein the reactive sputtering chamber comprises an IGZO target and an inlet for flowing a reactive species containing sulfur; and
    flowing the reactive species into the chamber as the IGZO target is used to sputter a film over the substrate, wherein the sulfur in the reactive species deposits into the IGZO film as the IGZO film is deposited on the substrate to form the IGZOS film, and wherein the sulfur concentration is between 30% and 50% of the volume of the IGZOS film.

12. The method of claim 11, further comprising:
    increasing the flow-rate of the reactive species over time.

13. The method of claim 11, wherein the flow-rate of the reactive species is ramped up or down at a point during the sputtering process.

14. The method of claim 11, wherein the chamber includes a corrosion resistant coating along the chamber walls.

15. A method of forming a sulfur alloyed InGaZnO (IGZOS) film, comprising:
    depositing an IGZO film over a surface of a substrate; and
    doping the IGZO film with a sulfur source, wherein the sulfur concentration is between 30% and 50% of the volume of the IGZO film.

16. The method of claim 15, wherein the sulfur source is sulfur ions.

17. The method of claim 16, wherein the sulfur ions are implanted into the IGZO film with an ion implantation device.

18. The method of claim 15, wherein the sulfur source is a sulfur gas, and wherein the sulfur gas is diffused into the IGZO film with a sulfurization process.

19. The method of claim 15, wherein the sulfur source is a sulfur containing film deposited over the IGZO film, and wherein doping the IGZO film comprises applying thermal energy to the IGZO film to initiate solid state diffusion.

20. The method of claim 19, wherein the thermal energy is provided by laser pulses from a laser.

21. A method of forming a p-type sulfur alloyed InGaZnO (IGZOS) based thin-film-transistor, comprising:
    forming a gate electrode over a substrate;
    forming a gate dielectric layer over the gate electrode;
    forming an IGZOS film layer over the gate dielectric layer, wherein the sulfur concentration is between 30% and 50% of the volume of the IGZOS film;
    depositing a source/drain layer over the IGZOS film; and
    patterning the source/drain layer to form a source region and a drain region, wherein an opening between the source region and the drain region defines a channel region in the IGZOS film.

22. The method of claim 21, wherein the IGZOS film is formed with a reactive sputtering process, an ion implantation process, a sulfurization process, a thermal diffusion process, or a laser assisted diffusion process.

23. The method of claim 22, wherein a maximum temperature does not raise above approximately 400° C. during the formation of the IGZOS film.

24. The method of claim 21, wherein the p-type IGZOS thin-film-transistor is formed on a glass substrate that is used in a display device.

* * * * *